(12) United States Patent
Priel et al.

(10) Patent No.: US 8,749,292 B2
(45) Date of Patent: Jun. 10, 2014

(54) VOLTAGE LEVEL SHIFTER HAVING A FIRST OPERATING MODE AND A SECOND OPERATING MODE

(75) Inventors: Michael Priel, Hertzelia (IL); Sergey Sofer, Reshon Letzion (IL); Dov Tzytkin, Ness Zyiona (IL)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/635,186

(22) PCT Filed: Apr. 22, 2010

(86) PCT No.: PCT/IB2010/051766
§ 371 (c)(1),
(2), (4) Date: Sep. 14, 2012

(87) PCT Pub. No.: WO2011/132022
PCT Pub. Date: Oct. 27, 2011

(65) Prior Publication Data
US 2013/0027109 A1    Jan. 31, 2013

(51) Int. Cl.
*H03L 5/00*    (2006.01)
(52) U.S. Cl.
USPC ............................... 327/333; 326/62; 326/81
(58) Field of Classification Search
USPC ................. 326/62–63, 80–82; 327/306, 333
See application file for complete search history.

(56) References Cited

U.S. PATENT DOCUMENTS

| | | | |
|---|---|---|---|
| 7,005,908 B2 | 2/2006 | Lee et al. | |
| 7,112,996 B2 | 9/2006 | Lee | |
| 7,248,075 B2 | 7/2007 | Min et al. | |
| 7,501,856 B2 | 3/2009 | Huang | |
| 7,541,837 B2 | 6/2009 | Lines | |
| 7,567,112 B2 | 7/2009 | Shen | |
| 7,839,170 B1 * | 11/2010 | Yang et al. | 326/68 |
| 2005/0168241 A1 * | 8/2005 | Kim | 326/81 |
| 2006/0290405 A1 | 12/2006 | Kim et al. | |

OTHER PUBLICATIONS

International Search Report and Written Opinion correlating to PCT/IB2010/051766 dated Jan. 21, 2011.

* cited by examiner

*Primary Examiner* — Dinh T. Le

(57) ABSTRACT

Embodiments of the present invention provide a voltage level shifter used to translate a binary input signal representing a binary sequence to a binary output signal representing the same binary sequence. The input signal is provided by an input voltage varying between a first input voltage level and a second input voltage level. The output signal is provided by an output voltage varying between a first output voltage level and a second output voltage level. The output signal has a delay relative to the input signal, and the voltage level shifter has a leakage current. The voltage level shifter has a first operating mode and a second operating mode. In the second operating mode, the delay is shorter while the leakage current is higher than in the first operating mode.

20 Claims, 7 Drawing Sheets

US 8,749,292 B2

VOLTAGE LEVEL SHIFTER HAVING A FIRST OPERATING MODE AND A SECOND OPERATING MODE

FIELD OF THE INVENTION

This invention relates to a voltage level shifter, an apparatus, and a method as described in the accompanying claims.

BACKGROUND OF THE INVENTION

Voltage level shifters are well-known and described for example in U.S. Pat. No. 7,541,837, U.S. Pat. No. 7,501,856 and U.S. Pat. No. 7,567,112. Voltage level shifters serve to translate a binary input signal representing a binary sequence to a binary output signal representing the same binary sequence, with different high/low voltages for the output signal and for the input signal, respectively. The input signal is provided by an input voltage varying between a first input voltage level and a second input voltage level. The output signal is provided by an output voltage varying between a first output voltage level and a second output voltage level, of which at least one is different from the corresponding input voltage level.

Quite generally, the requirement for high frequency and low power of processors, notably for mobile products, often results in complex power management schemes with mixing power domains, supplied by different power supply voltages. A level shifter can be a critical cell, as it participates in timing the critical path. Although in many high performance conditions, voltage levels are usually fairly close and a level shifter may not be required in these conditions, the level shifter is often still included with an impact on the overall delay.

Schematically shown in FIG. 1 is an example of a conventional differential voltage level shifter 1. Level shifter 1 comprises an input port 12 for receiving an input signal IN_L, an output port 14 for delivering a corresponding output signal OUT_H, a node 16, supply voltage providers 18 and 20, PMOS transistors 22 and 26, NMOS transistors 24 and 28, and an inverter 30. PMOS 22 and NMOS 24 form a first pull-up-pull-down-stage 22, 24. PMOS 26 and NMOS 28 form a second pull-up-pull-down-stage 26, 28. Each of the first pull-up-pull-down stage and the second pull-up-pull down stage has a first state and a second state and is arranged to deliver the first output voltage level VBB when in its first state and the second output voltage level VPP when in its second state. The first pull-up-pull-down stage and the second pull-up-pull-down stage are cross-coupled. Any one of the first pull-up-pull-down stage and the second pull-up-pull-down stage assuming its first state favors the respective other one of the first pull-up-pull down stage and the second pull-up-pull-down stage to assume its second state. Similarly, any one of the first pull-up-pull-down stage and the second pull-up-pull-down stage assuming its second state favors the respective other one of the first pull-up-pull-down stage and the second pull-up-pull-down stage to assume its first state.

The input signal IN_L is provided by an input voltage VIN which varies between a first input voltage level VSS (low) and a second input voltage level VDD (high). The output signal OUT_H is provided by an output voltage VOUT which varies between the first output voltage level VBB and the second output voltage level VPP. The binary input signal IN_L represents a binary sequence, and the above mentioned components are coupled to each other in such a manner as to translate the binary input signal IN_L to the binary output signal OUT_H so that both signals represent the same binary sequence, but with the high-low voltage difference being higher (or lower) at the output side than at the input side. The input voltage VIN assuming the first input voltage level VSS causes the first pull-up-pull-down stage 22, 24 to assume its second state and the second pull-up-pull-down stage 26, 28 to assume its first state, whereas the input voltage VIN assuming the second input voltage level (VDD) causes the first pull-up-pull-down stage 22, 24 to assume its first state and the second pull-up-pull-down stage 26, 28 to assume its second state.

More specifically, the level shifter 1 operates as follows. When input voltage VIN is at voltage level VSS (low), NMOS 24 and PMOS 26 are conductive (open) whereas NMOS 28 and PMOS 22 are non-conductive (closed), and the output voltage VOUT which is present at node 16 and at output port 14 is at voltage level VPP (high). In contrast, when the input voltage VIN assumes the voltage level VDD (high), NMOS 28 and PMOS 22 are open while NMOS 24 and PMOS 26 are closed, and the output voltage VOUT assumes the voltage level VBB (low).

The double-stage structure formed of first stage 22, 24 and second stage 26, 28 effectively suppresses leakage currents between the VBB-VPP voltage domain (on the input side) and the VSS-VDD voltage domain (on the output side). On the other hand, it involves a fairly important propagation delay, i.e. a time delay between the output signal OUT_H relative to the input signal IN_L. A leakage current in this context is an electric current that persists when the output voltage VOUT has assumed one of its stationary levels (VBB and VPP). Quite generally, a trade-off often needs to be made between leakage currents and the propagation delay.

SUMMARY OF THE INVENTION

The present invention provides a voltage level shifter, an apparatus, and a method as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may, for the most part, be implemented using electronic components and circuits known to those skilled in the art, details will not be explained in any greater extent than that considered necessary, for the understanding and appreciation of the underlying concepts of the present invention and in order not to obfuscate or distract from the teachings of the present invention.

Figure 2:
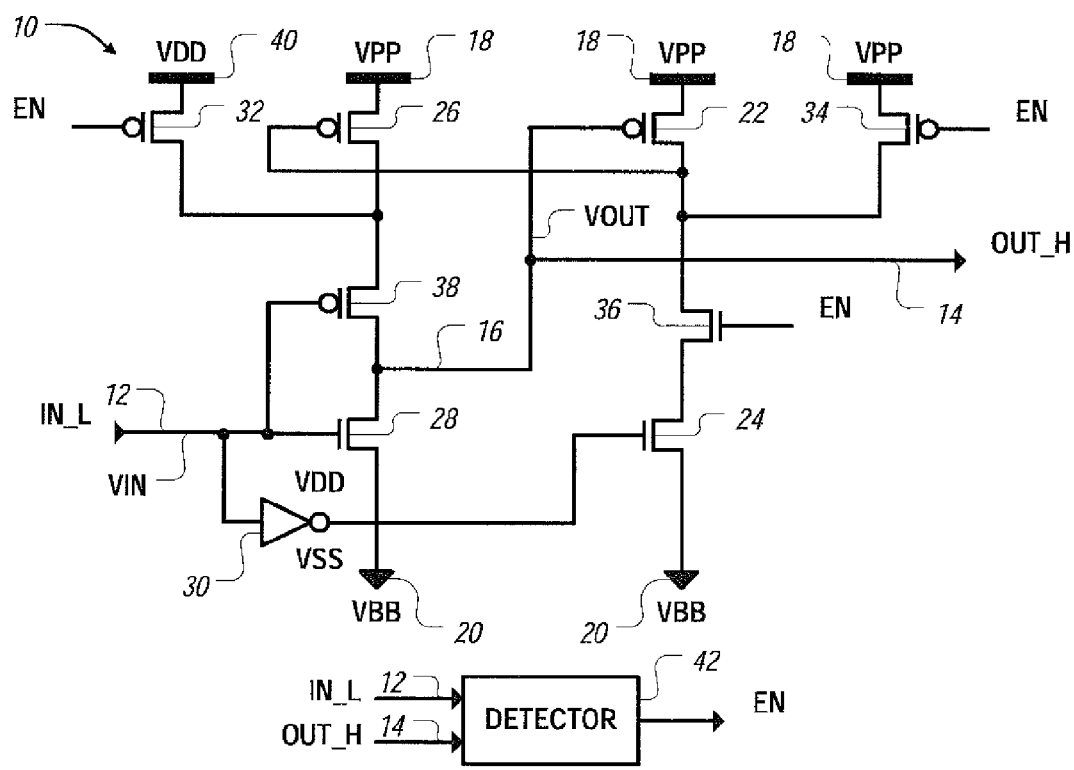
FIG. 2 schematically shows an example of another embodiment of a level shifter.

Referring to FIG. 2, there is shown a voltage level shifter 10. The level shifter 10 has a first operating mode and a second operating mode. In the second operating mode, the level shifter has a shorter propagation delay, i.e. a shorter delay of the output signal relative to the input signal, but involves a larger leakage current between the two voltage domains, i.e. between the VSS-VDD domain and the VBB-VPP domain. An operating condition can be determined and the first operating mode and the second operating mode can be selected alternatively on the basis of the operating condition.

Figure 1:
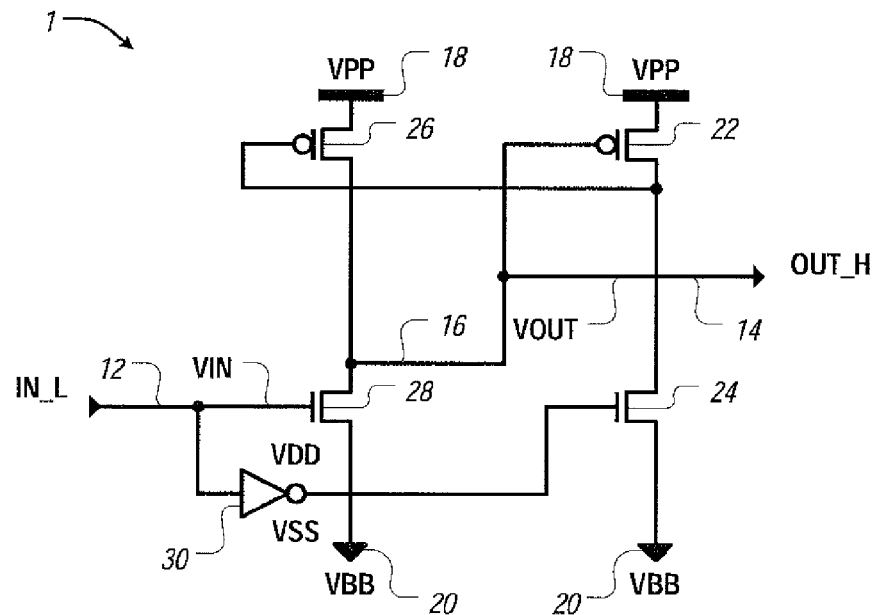
FIG. 1 schematically shows an example of an embodiment of a voltage level shifter.

More specifically, the shifter has a first operating mode (low leakage mode) in which the output signal has a first delay relative to the input signal. The level shifter 10 of FIG. 2 differs from the one described above with reference to FIG. 1 at least in that it comprises additional components which interact with the components shown in FIG. 1 to provide a second operating mode (fast mode). In the second operating mode, the output signal has a second delay relative to the input signal, shorter than the first delay. The second operating mode may be selected, for example, when speed (i.e. a short propagation delay) is more desirable than an effective suppression of leakage currents between the two voltage domains connected by the voltage level shifter. In addition to the components discussed above with reference to FIG. 1, the present exemplary level shifter 10 comprises a mode selection unit. In this example, the unit includes switches 32, 34, 36 (in this example three) which are arranged so as to allow selecting between the first operating mode and the second operating mode. Although other configurations may be used, in this example, switches 32, 34, 36 can selectively enable/disable a second input voltage level as alternative to the first voltage level VSS, as explained below in more detail. The level shifter 10 further comprises an additional switch 38 and an additional supply voltage provider 40. Supply voltage provider 40 provides a second input voltage level VDD different from VBB. In the present example, switches 32, 34, and 38 are PMOS transistors, while switch 36 is an NMOS transistor. PMOS 38 has its source coupled to the drain of PMOS 26 and its drain coupled to the source of NMOS 28, and its gate coupled to the input port 12. PMOS 32 has its source coupled to supply voltage provider 40 and its drain coupled to the drain of PMOS 26. PMOS 34 has its source coupled to supply voltage provider 18 and its drain coupled to the drain of PMOS 22. NMOS 36 has its source coupled to the drain of NMOS 24 and its drain coupled to the drain of PMOS 22.

In the example, switches 32, 34, 36 are responsive to a mode selection voltage (enable voltage) EN. A first level of the mode selection voltage EN sets the voltage level shifter 10 in the first operating mode. A second level of the mode selection voltage EN sets the voltage level shifter 10 in the second operating mode. The gates of transistors 32, 34, and 36 may all be connected to a controller (not shown) for providing alternatively the first level of the mode selection voltage or the second level of the mode selection voltage. In the example, the second and first levels of the mode selection voltage EN are VBB (low) and VPP (high), respectively. In other words, EN=VPP sets the level shifter in the first operating mode, whereas EN=VBB sets the level shifter in the second operating mode.

The voltage level shifter 10 may comprise a detector for determining an operating condition. In such case, the switches 32, 34, 36 select between the first operating mode and the second operating mode on the basis of the operating condition, for example by the controller providing either VBB or VPP depending on the condition. The operating condition may, for example, be one of a bit rate of the input signal, the first input voltage level (VSS), the second input voltage level (VDD), the first output voltage level (VBB), the second output voltage level (VPP), a process corner, a temperature, and any combination thereof, or another suitable operating condition. In the present example, detector 42 receives input signal IN_L and output signal OUT_H and determines the operating condition and generates the mode selection voltage EN to provide either VBB or VPP in accordance with the determined operating condition.

The voltage level shifter 10 of this example operates as follows.

When the mode selection voltage EN is set to VPP (high) to select the first operating mode, PMOS transistors 32 and 34 are both closed. NMOS 36 and PMOS 38 may be open or closed, as they are arranged in such a manner that they do not significantly modify the behaviour of the circuit as compared to the one in FIG. 1 (as long as EN=VPP). When the input voltage VIN is VSS (low), transistors 24, 36, 26 and 38 are open, transistors 22 and 28 are closed, and the output voltage VOUT is VPP (high). In contrast, when the input voltage VIN is at VDD (high), transistors 28 and 22 are open, transistors 24 and 26 are closed, and the output voltage VOUT is VBB (low). The state of PMOS 38 is then undefined, which is of no consequence as PMOS 26 and PMOS 32 are both closed. Similarly, the state of NMOS 36 is undefined when VIN=VDD.

The second operating mode is selected by applying the mode selection voltage EN=VBB at the gates of transistors 32, 34, 36. As a consequence, transistors 32 and 34 are open while transistor 36 is closed. Furthermore, PMOS 34 being open, PMOS 26 is closed. The circuit 10 thus reduces to a simple inverter 28, 38 operating at voltage levels VBB (low) and (VDD) high. In the case where VDD is less than VPP, the level shifter 10 thus reduces to a simple inverter 28, which is underdriven with respect to the power supply voltage level VPP. Notably the first pull-up-pull-down-stage 22, 24 is deactivated. Thus the first pull-up-pull-down stage 22, 24 is not responsive to the second pull-up-pull-down stage 26, 28, and it behaves as an inverter. Compared to the first operating mode, the propagation delay is reduced, while the leakage current between the two voltage domains is increased.

The second operating mode may be particularly beneficial when the first input voltage level (VSS) and the first output voltage level (VBB) differ from each other by a value that does not exceed the MOSFET threshold voltage that is characteristic to the specific manufacturing technology. For instance, for the silicon manufacturing technology of 65 nm (bulk), the difference is typically less than 0.2 V, and the second input voltage level (VDD) and the second output voltage level (VPP) might differ from each other by less than 0.2 V, considering the typical power supply voltage at the level of 1.0 V.

Figure 3:
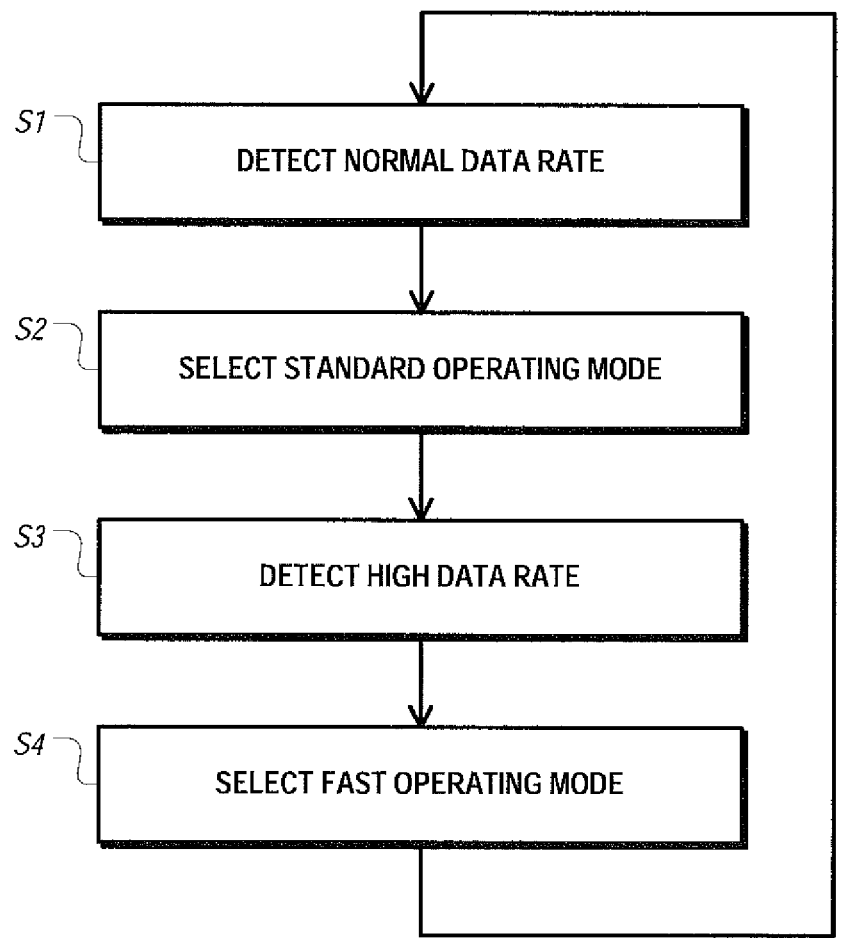
FIG. 3 shows a schematic flow chart of an example of an embodiment of a method of operating a voltage level shifter.

Referring now to FIG. 3, there is illustrated in a simplified manner an example of a method of operating a voltage level shifter. Those skilled in the art will recognize that boundaries between the described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments. The voltage level shifter may for example be implemented as a circuit as discussed above with reference to FIG. 2. In the present example, the binary input signal IN_L has a bit rate (measured in bits per seconds) which is detected by a detector. If the detected data rate is found to be a normal data rate (step S1), the first operating mode (low leakage mode) is selected (step S2). When a high data rate is detected (step S3), the second operating mode (fast mode) is selected (step S4). The process may eventually return to step S1.

Figure 4:
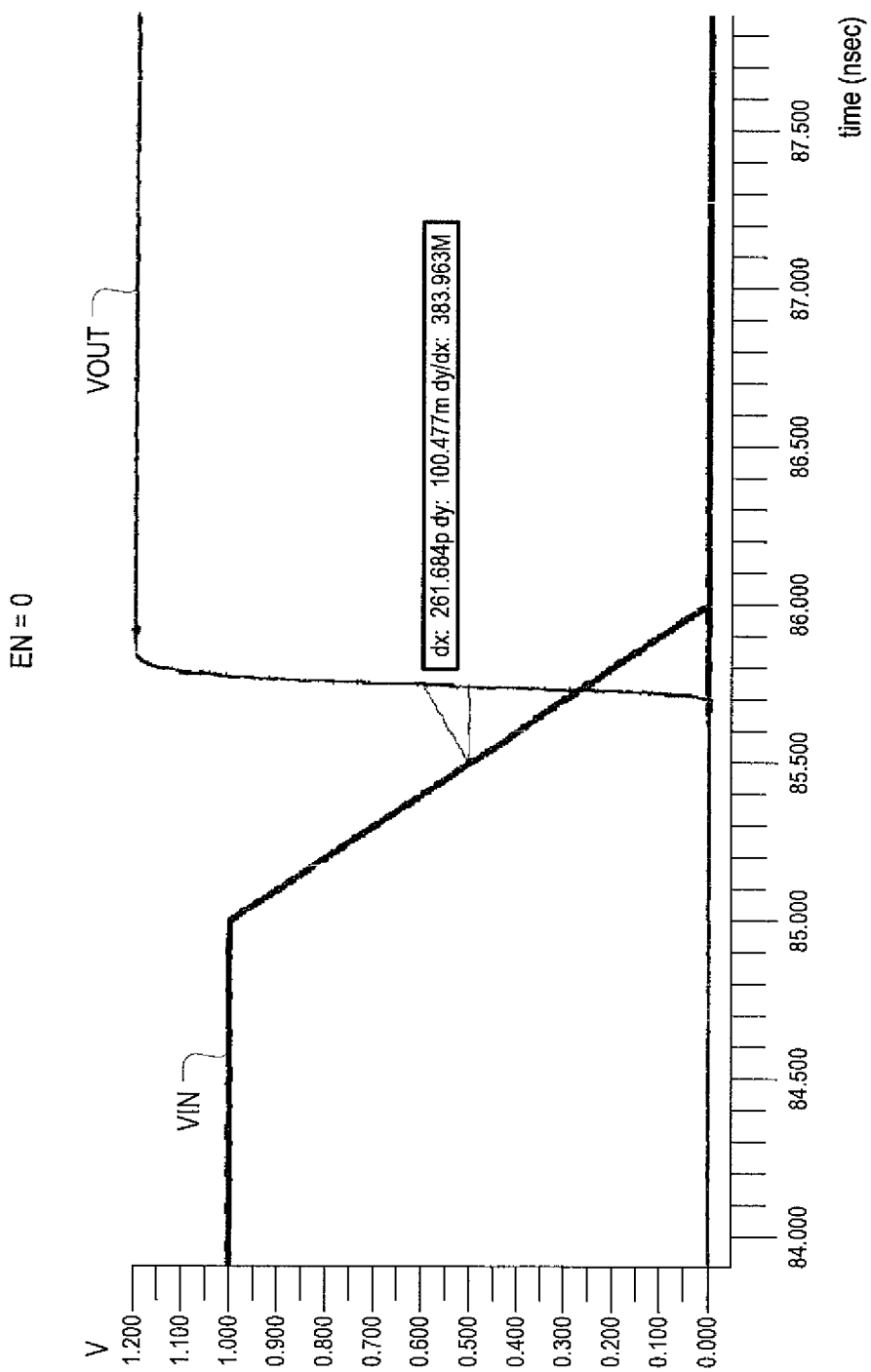
FIG. 4 schematically represents an experimental input signal and a resulting output signal obtained with a second operating mode.
Figure 5:
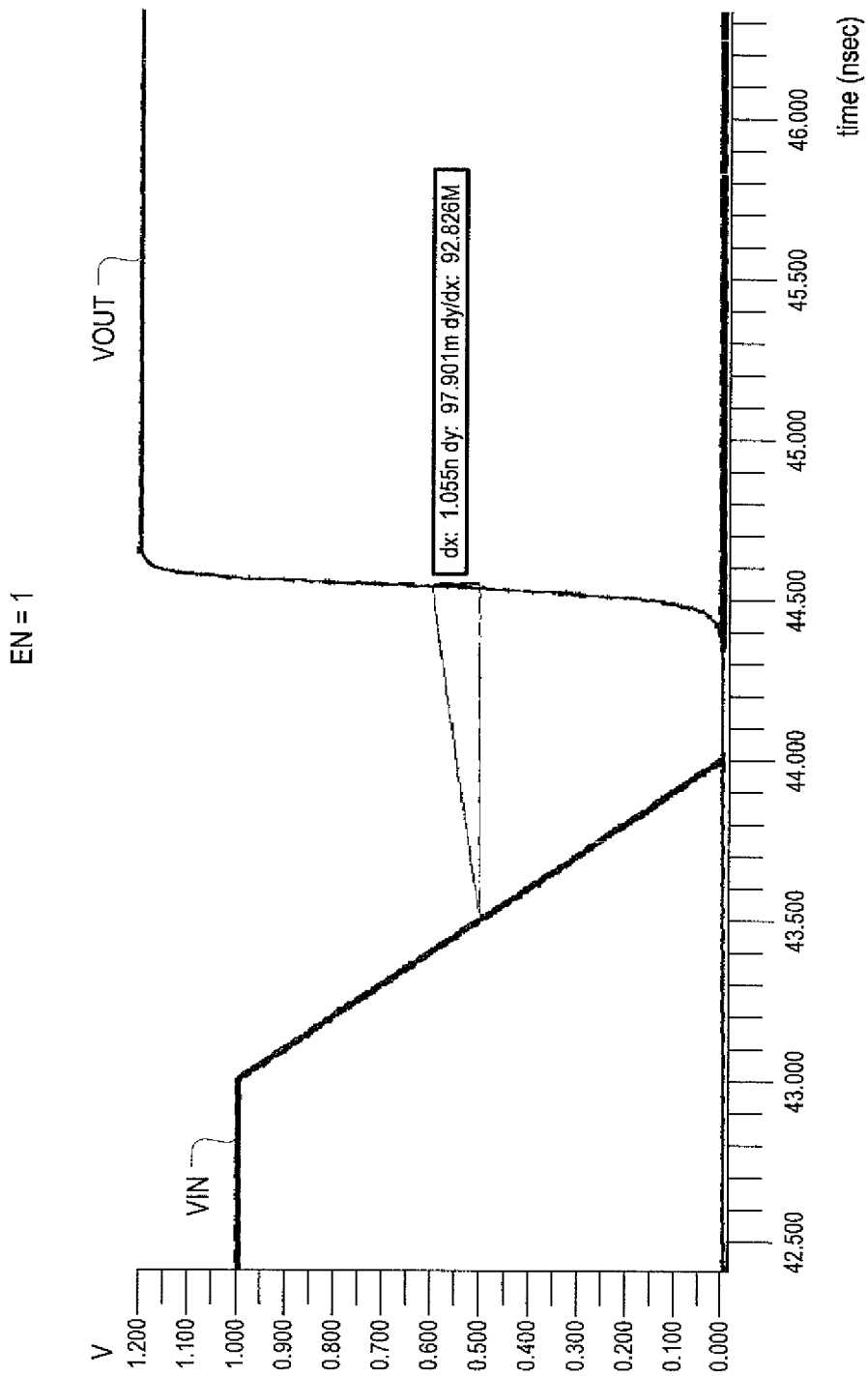
FIG. 5 schematically represents an experimental input signal and a resulting output signal obtained with a first operating mode.

Referring now to FIGS. 4 and 5, there are represented as functions of time t the input voltage VIN (graph VIN) which is fed to the input port 12 and a resulting output voltage VOUT (graph VOUT) obtained at the output port 14 of a specific embodiment of a voltage level shifter 10 of the type described above with reference to FIG. 2. The level shifter 10 was manufactured using 65-nanometer (65 nm) silicon manufacturing technology. In both FIGs the input voltage VIN exhibits a falling edge (transition from high to low). The output voltage VOUT accordingly exhibits a rising edge (transition from low to high). FIG. 4 relates to the second operating mode (fast mode), whereas FIG. 5 relates to the first operating mode (low leakage mode). I.e., in FIG. 4 the mode selection voltage EN is VBB (low), while in FIG. 5 the mode selection voltage is VPP (high). Comparing FIGS. 4 and 5, it is seen that the voltage level shifter has a considerably shorter propagation delay in the fast mode as compared to the low leakage mode.

Figure 6:
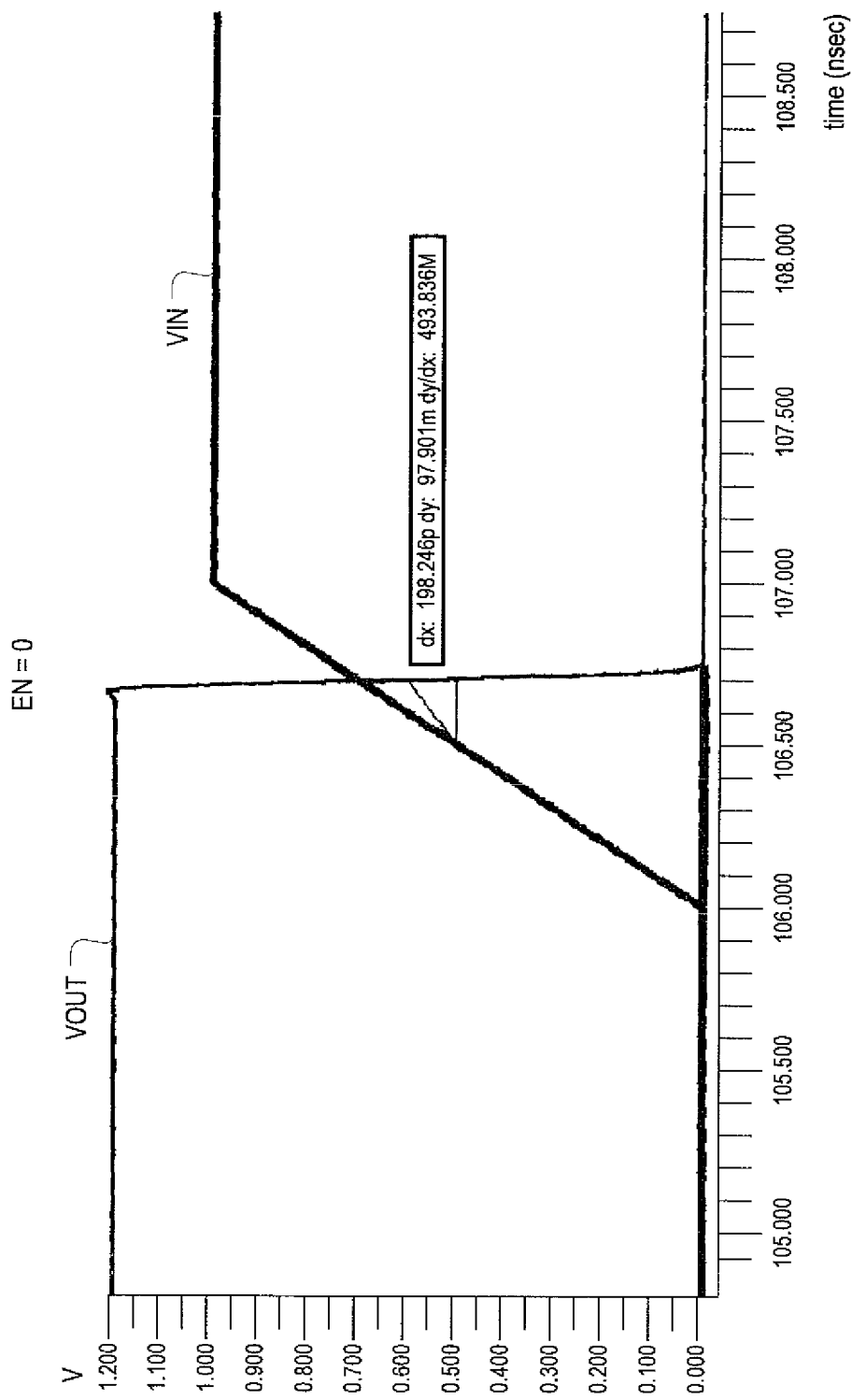
FIG. 6 schematically represents another experimental input signal and a resulting output signal observed with the second operating mode.
Figure 7:
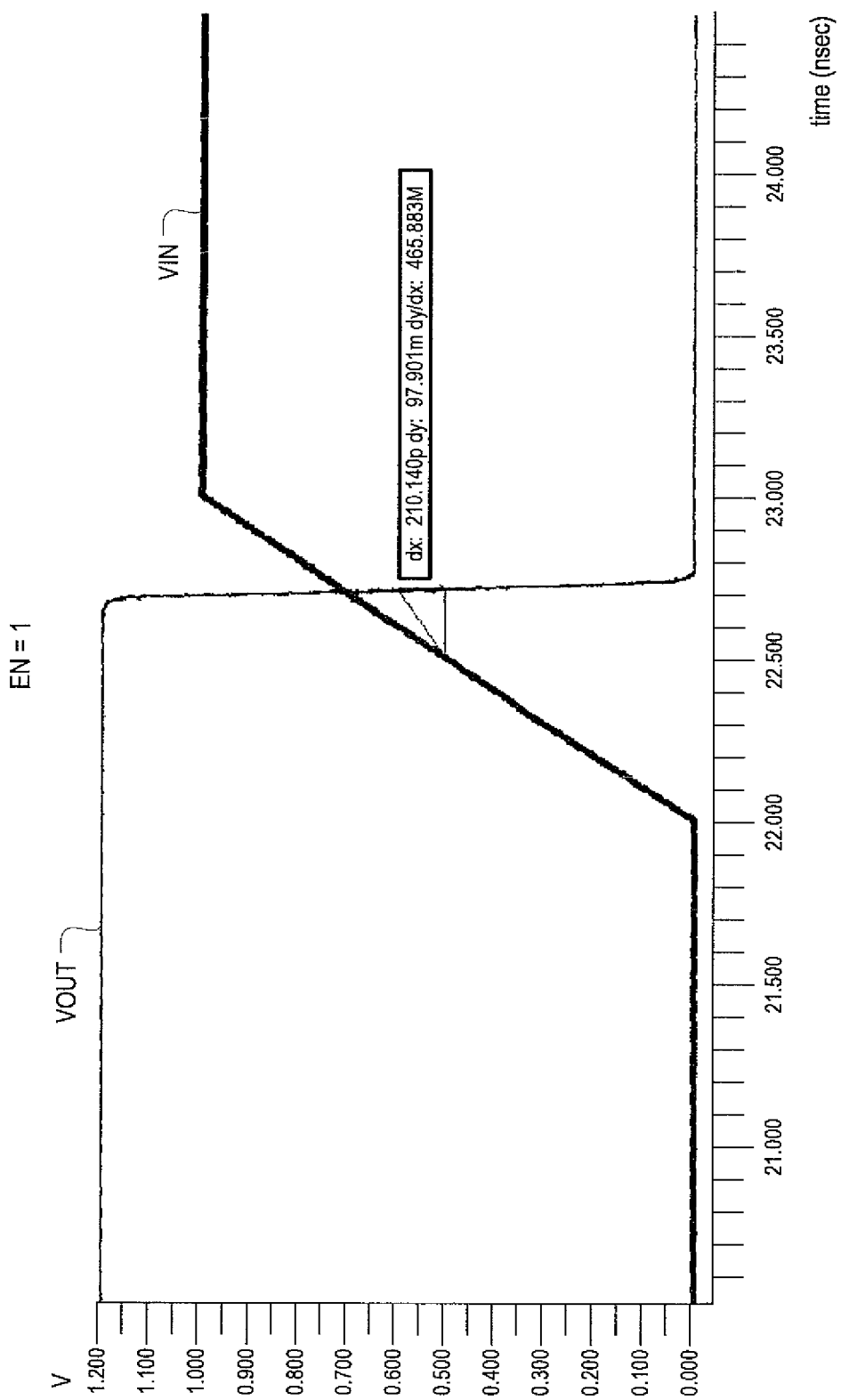
FIG. 7 schematically represents another experimental input signal and a resulting output signal obtained with the first operating mode.

FIGS. 6 and 7 are analogous to FIGS. 4 and 5, respectively. Graph VIN represents the input voltage while graph VOUT represents the resulting output voltage, as functions of time t. Now the input voltage VIN exhibits a rising edge, while the output voltage VOUT exhibits a corresponding falling edge. FIG. 6 refers to the second operating mode (fast mode), while FIG. 7 refers to the first operating mode (full contention mode). FIGS. 6 and 7 show that in the event of a rising edge in the input signal, the delay of the corresponding falling edge in the output signal is about equal for both operating modes. This is explained by the fact that in the low leakage mode the level shifter circuit 10 as shown in FIG. 2 has a certain asymmetry due to the fact that the first pull-up-pull-down-stage 22, 24 receives the inverted (by inverter 30) and thus delayed input signal, whereas the second pull-up-pull-down-stage 26, 38 receives the input signal directly.

Figure 8:
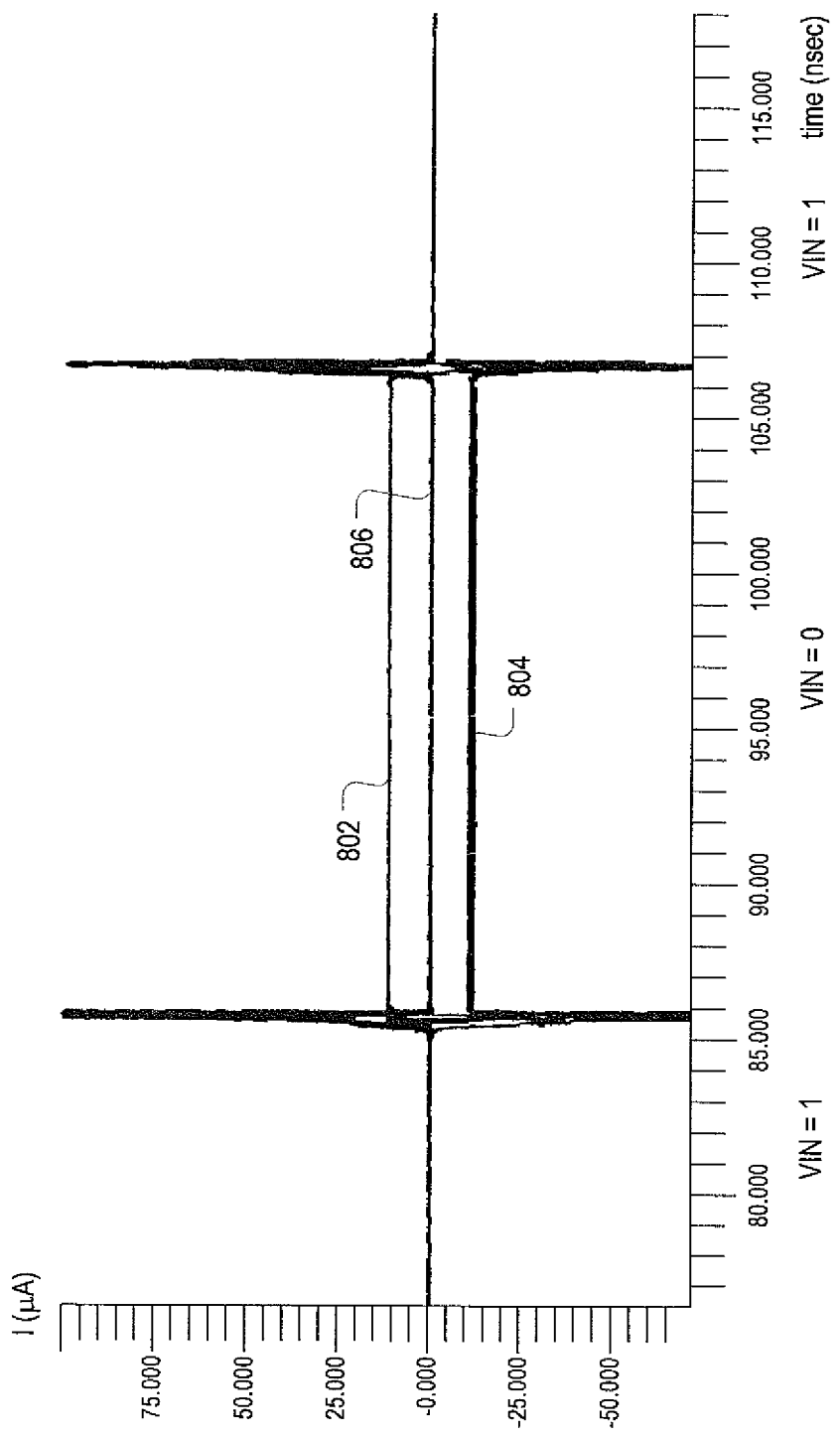
FIG. 8 schematically represents leakage currents observed in the first operating mode and in the second operating mode.

Finally, referring to FIG. 8, there are plotted leakage currents 802, 804, and 806 observed as functions of time during the interval between a falling edge and the subsequent rising edge in the input voltage VIN. Currents 802 and 804 were observed at the high potential provider 18 and at the low potential provider 20, respectively, for the second operating mode (fast mode). Current 806 was observed in the first operating mode. The fast mode clearly involves a substantially higher leakage current as compared to the low leakage mode. In these exemplary experiments based on 65 nm silicon manufacturing technology, a propagation delay of 0.59 ns/0.65 ns was observed in the fast mode compared to 0.6 ns/1.5 ns in the normal mode. A leakage current of 11.1 µA was observed in the fast mode compared to only 6 nA in the normal mode.

The voltage level shifter 10 as described above with reference to FIG. 2 may also be integrated in an apparatus which comprises a first logic domain for providing an input voltage (VIN) varying between a first input voltage level (VSS) and a second input voltage level (VDD) to represent a binary sequence, the voltage level shifter 10, for receiving, as an input signal, the input voltage (VIN) and for generating, as an output signal, an output voltage (VOUT) varying between a first output voltage level (VBB) and a second output voltage level (VPP) to represent the same binary sequence, a second logic domain for processing the binary sequence on the basis of the output voltage (VOUT).

In the foregoing specification, the invention has been described with reference to specific examples of embodiments of the invention. It will, however, be evident that various modifications and changes may be made therein without departing from the broader spirit and scope of the invention as set forth in the appended claims. For example, a separate inverter could be used to provide the second operating mode.

The switches as discussed herein may be any kind of switch suitable to couple an element of an electronic circuit to another element of the same or different circuit. Although in the embodiments discussed above, the switches are PMOS and NMOS transistors, they may be implemented differently. For instance, a PMOS transistor may be replaced by an NMOS transistor and vice versa. Alternatively, a switch may be implemented as a bipolar transistor, photodiode, cathode ray tube, or any other suitable control element.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A voltage level shifter comprising:
an input port operable to receive a binary input signal transitioning from a first input voltage representative of a first logic state to a second input voltage representative of a second logic state;
an output port operable to provide a binary output signal transitioning from a first output voltage representative of the first logic state to a second output voltage representative of the second logic state;
a detector operably coupled to the input port and the output port, and configured to determine an operating condition, the detector comprising a detector output operable to provide a mode selection signal transitioning, based on the operating condition, between a first mode selection voltage representative of a first operating mode of the voltage level shifter and a second mode selection voltage representative of a second operating mode of the voltage level shifter;
a mode selection unit operable to receive the mode selection signal, the mode selection unit configured to select, based on the mode selection signal, between the first operating mode of the voltage level shifter and the second operating mode of the voltage level shifter; and
a first pull-up-pull-down stage and a second pull-up-pull-down stage operably coupled to the input port, the output port, and the mode selection unit, the first pull-up-pull-down stage and the second pull-up-pull-down stage configured to translate the binary input signal to the binary output signal, the binary output signal having a first delay relative to the binary input signal and the voltage level shifter having a first leakage current when the voltage level shifter is in the first operating mode, the binary output signal having a second delay relative to the binary input signal and the voltage level shifter having a second leakage current when the voltage level shifter is in the second operating mode, the second delay is shorter than the first delay and the second leakage current is higher than the first leakage current.

2. The voltage level shifter as set forth in claim 1, wherein the mode selection unit comprises one or more switches for selecting alternatively the first operating mode of the voltage level shifter and the second operating mode of the voltage level shifter.

3. The voltage level shifter as set forth in claim 1, wherein
the mode selection unit sets the voltage level shifter in the first operating mode when the mode selection signal transitions to the first mode selection voltage, and
the mode selection unit sets the voltage level shifter in the second operating mode when the mode selection signal transitions to the second mode selection voltage.

4. The voltage level shifter as set forth in claim 1, wherein the operating condition is one or more of a bit rate of the binary input signal, the first input voltage, the second input voltage, the first output voltage, the second output voltage, a process corner, and a temperature.

5. The voltage level shifter as set forth in claim 1,
wherein
each of the first pull-up-pull-down stage and the second pull-up-pull-down stage has a first state and a second state and each are arranged to deliver the binary output signal transitioned to the first output voltage when in the first state and the binary output signal transitioned to the second output voltage when in the second state, and
the first pull-up-pull-down stage and the second pull-up-pull-down stage are cross-coupled.

6. The voltage level shifter as set forth in claim 5, wherein any one of the first pull-up-pull-down stage and the second pull-up-pull-down stage transitioning to the first state, based on the binary input signal, causes the respective other one of the first pull-up-pull-down stage and the second pull-up-pull-down stage to transition to the second state.

7. The voltage level shifter as set forth in claim 5, wherein anyone of the first pull-up-pull-down stage and the second pull-up-pull-down stage transitioning to the second state, based on the binary input signal, causes the respective other one of the first pull-up-pull-down stage and the second pull-up-pull-down stage to transition to the first state.

8. The voltage level shifter as set forth in claim 5, wherein in the first operating mode of the voltage level shifter, the binary input signal transitioning to the first input voltage causes the first pull-up-pull-down stage to transition to the second state and the second pull-up-pull-down stage to transition to the first state, and the binary input signal transitioning to the second input voltage causes the first pull-up-pull-down stage to transition to the first state and the second pull-up-pull-down stage to transition to the second state.

9. The voltage level shifter as set forth in claim 5, wherein in the second operating mode of the voltage level shifter, the first pull-up-pull-down stage is not responsive to the second pull-up-pull-down stage and behaves as an inverter.

10. The voltage level shifter as set forth in claim 1, wherein the voltage level shifter, when in the second operating mode, behaves as an inverter.

11. The voltage level shifter as set forth in claim 1, further comprising:
a third supply voltage provider and a fifth switch configured to allow the voltage level shifter to operably provide the binary output signal transitioning from the first output voltage representative of the first logic state to a third output voltage representative of the second logic state when the voltage level shifter is in the second operating mode, the third output voltage is different than the second output voltage level and results in the second delay being shorter than the first delay and the second leakage current being higher than the first leakage current.

12. An apparatus comprising:
a first logic domain operable to provide a binary input signal transitioning from a first input voltage representative of a first logic state to a second input voltage representative of a second logic state;
a voltage level shifter comprising:
an input port operable to receive the binary input signal, an output port operable to provide a binary output signal transitioning from a first output voltage representative of the first logic state to a second output voltage representative of the second logic state,
a detector operably coupled to the input port and the output port, and configured to determine an operating condition, the detector comprising a detector output operable to provide a mode selection signal transitioning, based on the operating condition, between a first mode selection voltage representative of a first operating mode of the voltage level shifter and a second mode selection voltage representative of a second operating mode of the voltage level shifter,
a mode selection unit operable to receive the mode selection signal, the mode selection unit configured to select, based on the mode selection signal, between the first operating mode of the voltage level shifter and the second operating mode of the voltage level shifter, and
a first pull-up-pull-down stage and a second pull-up-pull-down stage operably coupled to the input port, the output port, and the mode selection unit, the first pull-up-pull-down stage and the second pull-up-pull-down stage configured to translate the binary input signal to the binary output signal, the binary output signal having a first delay relative to the binary input signal and the voltage level shifter having a first leakage current when the voltage level shifter is in the first operating mode, the binary output signal having a second delay relative to the binary input signal and the voltage level shifter having a second leakage current when the voltage level shifter is in the second operating mode, the second delay is shorter than the first delay and the second leakage current is higher than the first leakage current; and
a second logic domain operable to process the binary output signal.

13. The apparatus as set forth in claim 12, wherein the first input voltage and the first output voltage differ from each other by less than 0.2 V, and the second input voltage and the second output voltage differ from each other by less than 0.2 V.

14. The apparatus as set forth in claim 12, wherein the operating condition is one or more of a bit rate of the binary input signal, the first input voltage, the second input voltage, the first output voltage, the second output voltage, a process corner, and a temperature.

15. The apparatus as set forth in claim 12, wherein the mode selection unit comprises one or more switches for selecting alternatively the first operating mode of the voltage level shifter and the second operating mode of the voltage level shifter.

16. The apparatus as set forth in claim 12, wherein
the mode selection unit sets the voltage level shifter in the first operating mode when the mode selection signal transitions to the first mode selection voltage, and
the mode selection unit sets the voltage level shifter in the second operating mode when the mode selection signal transitions to the second mode selection voltage.

17. The apparatus as set forth in claim 12, wherein
each of the first pull-up-pull-down stage and the second pull-up-pull-down stage has a first state and a second state and each are arranged to deliver the binary output signal transitioned to the first output voltage when in the first state and the binary output signal transitioned to the second output voltage when in the second state, and
the first pull-up-pull-down stage and the second pull-up-pull-down stage are cross-coupled.

18. The apparatus as set forth in claim 12, wherein the voltage level shifter, when in the second operating mode, behaves as an inverter.

19. A method of operating a voltage level shifter, comprising:
receiving, at a first time, a binary input signal at an input port of the voltage level shifter, the binary input signal transitioning from a first input voltage representative of a first logic state to a second input voltage representative of a second logic state;
in response to receiving the binary input signal, determining an operating condition by a detector and, based on the operating condition, providing at a detector output port of the detector a mode selection signal transitioning between a first mode selection voltage representative of a first operating mode of the voltage level shifter and a second mode selection voltage representative of a second operating mode of the voltage level shifter, wherein the detector is operably coupled to the input port and an output port of the voltage level shifter, and die detector output port is operably couple to a mode selection input port of the voltage level shifter;
in response to receiving the mode selection signal at the mode selection input port, selecting the first operating mode of the voltage level shifter when the mode selection signal transitions to the first mode selection voltage and selecting the second operating mode of the voltage level shifter when the mode selection signal transitions to the second mode selection voltage;
in response to the selecting the first operating mode of the voltage level shifter, translating, at a second time after the first time, the binary input signal to a binary output signal, wherein a first leakage current occurs in the voltage level shifter and the binary output signal has a first delay relative to the binary input signal, wherein the first delay is equal to the difference between the second time and the first time;
in response to the selecting the second operating mode of the voltage level shifter, translating, at a third time after the first time, the binary input signal to the binary output signal, wherein a second leakage current occurs in the voltage level shifter and the binary output signal has a second delay relative to the binary input signal, wherein the second delay is equal to the difference between the third time and the first time;

providing the binary output signal at the output port transitioning from a first output voltage representative of the first logic state to a second output voltage representative of the second logic state; and wherein the second delay is shorter than the first delay and the second leakage current is higher than the first leakage current.

20. The method as set forth in claim 19, wherein the operating condition is one or more of a bit rate of the binary input signal, the first input voltage, the second input voltage, the first output voltage, the second output voltage, a process corner, and a temperature.

* * * * *